United States Patent
Hebert

(10) Patent No.: US 10,686,037 B2
(45) Date of Patent: Jun. 16, 2020

(54) SEMICONDUCTOR STRUCTURE WITH INSULATING SUBSTRATE AND FABRICATING METHOD THEREOF

(71) Applicant: Vanguard International Semiconductor Corporation, Hsinchu (TW)

(72) Inventor: Francois Hebert, Hsinchu (TW)

(73) Assignee: Vanguard International Semiconductor Corporation, Hsinchu (TW)

( * ) Notice: Subject to any disclaimer, the term of this patent is extended or adjusted under 35 U.S.C. 154(b) by 0 days.

(21) Appl. No.: 16/039,967

(22) Filed: Jul. 19, 2018

(65) Prior Publication Data
US 2020/0027951 A1   Jan. 23, 2020

(51) Int. Cl.
| H01L 29/08 | (2006.01) |
| H01L 29/06 | (2006.01) |
| H01L 29/26 | (2006.01) |
| H01L 21/02 | (2006.01) |
| H01L 21/8238 | (2006.01) |

(52) U.S. Cl.
CPC .... *H01L 29/0847* (2013.01); *H01L 21/02458* (2013.01); *H01L 21/02472* (2013.01); *H01L 21/823814* (2013.01); *H01L 21/823878* (2013.01); *H01L 29/0642* (2013.01); *H01L 29/26* (2013.01)

(58) Field of Classification Search
CPC . H01L 51/56; H01L 51/0097; H01L 51/5016; H01L 51/5056; H01L 51/5072
USPC ....................................................... 257/401
See application file for complete search history.

(56) References Cited

U.S. PATENT DOCUMENTS

| 8,247,300 B2* | 8/2012 | Babcock | H01L 21/82285 |
| | | | 257/E27.055 |
| 10,290,730 B1* | 5/2019 | Yang | H01L 29/205 |
| 2017/0288055 A1* | 10/2017 | Aktas | H01L 27/1203 |
| 2018/0005827 A1* | 1/2018 | Odnoblyudov | H01L 21/02381 |
| 2018/0061630 A1* | 3/2018 | Odnoblyudov | H01L 21/0257 |
| 2018/0240902 A1* | 8/2018 | Odnoblyudov | H01L 29/7786 |

FOREIGN PATENT DOCUMENTS

| JP | H04129267 A | 4/1992 |
| TW | 201001630 A | 1/2010 |
| TW | 201118941 A | 6/2011 |
| TW | 201128714 A | 8/2011 |

OTHER PUBLICATIONS

Office Action dated Oct. 3, 2019 in corresponding Taiwanese Application No. 107132615.

* cited by examiner

*Primary Examiner* — Andy Huynh
(74) *Attorney, Agent, or Firm* — Birch, Stewart, Kolasch & Birch, LLP

(57) ABSTRACT

A semiconductor structure includes an insulating substrate, an engineered layer, a semiconductor layer, and an isolation structure. The engineered layer is surrounding the insulating substrate. The semiconductor layer, which includes a first region and a second region,. is formed over the engineered layer. The isolation structure is formed in the semiconductor layer and located between the first region and the second region. A first transistor and a second transistor are formed in the first region and the second region respectively.

25 Claims, 7 Drawing Sheets

_US 10,686,037 B2_

SEMICONDUCTOR STRUCTURE WITH INSULATING SUBSTRATE AND FABRICATING METHOD THEREOF

BACKGROUND OF THE INVENTION

Field of the Invention

The disclosure relates generally to a semiconductor structure and a fabricating method thereof and more specifically relates to a semiconductor structure having an insulating substrate surrounded by an engineered layer and a fabricating method thereof.

Description of the Related Art

Since silicon substrates may lead to a significant substrate loss in radio-frequency (RF) applications, such technologies as Silicon on Insulators (SOI) and Silicon-on-Sapphire (SOS) are often applied in RF applications. SOI refers to a technology wherein different parts of a device circuit are built on small, separate islands of silicon that are fabricated over a thin insulating layer (referred to as the "buried oxide layer") formed over a semiconductor substrates (sometimes referred to as the "handle wafer"), in effect providing a certain degree of isolation between circuits on different islands. However, SOI wafers for RF applications are expensive and also require special processes or technologies to impact the carrier built-in at buried oxide and substrate interface.

SOS involves the epitaxial growth of silicon on a substrate of sapphire ($Al_2O_3$). This growth is termed 'heteroepitaxy', since the material of the grown layer is different from that of the substrate. Nonetheless, the equipment and materials used for the heteroepitaxial growth of SOS are essentially identical to those used in homoepitaxial growth. However, SOS may not able to be scaled to large diameters (for example, 300 mm SOS wafers are not feasible), the substrates of SOS are heavy, and they are much more expensive than SOI or silicon substrates. Another drawback of SOS is that the sapphire has a very low thermal conductivity then silicon, which can impact the performance and reliability of certain circuits and devices (including RF Power Amplifiers (RF PA) for example) fabricated on SOS.

Therefore, a substrate with lower substrate loss, and preferably a higher thermal conductivity, for RF applications is required and the cost should be reasonable and fair compared with known substrates.

BRIEF SUMMARY OF THE INVENTION

In an embodiment, a semiconductor structure, comprises an insulating substrate, an engineered layer, a semiconductor layer, an isolation structure, a first gate structure, a first source region and a first drain region, a second gate structure, and a second source region and a second drain region. The engineered layer surrounds the insulating substrate. The semiconductor layer is formed over the engineered layer and comprising a first region and a second region. The isolation structure is formed in the semiconductor layer and located between the first region and the second region. The first gate structure is formed over the semiconductor layer within the first region. The first source region and the first drain region are formed in the semiconductor layer within the first region. The first source region and the first drain region are located on both sides of the first gate structure. The second gate structure is formed over the semiconductor layer within the second region. The second source region and the second drain region are formed over the semiconductor layer within the second region. The second source region and the second drain region are located on both sides of the second gate structure.

According to an embodiment of the invention, the insulating substrate comprises aluminum nitride (preferably polycrystalline), polycrystalline silicon carbide, polycrystalline diamond, or a mixture thereof.

According to an embodiment of the invention, the insulating substrate comprises a top surface and a bottom surface, wherein the engineered layer comprises: a first oxide layer, a poly-silicon layer, a second oxide layer, a nitride layer, and a third oxide layer. The first oxide layer is formed around the insulating substrate. The poly-silicon layer is formed around the first oxide layer. The second oxide layer is formed around the poly-silicon layer. The nitride layer is formed around the second oxide layer. The third oxide layer is formed around the nitride layer.

According to an embodiment of the invention, the first oxide layer, the poly-silicon layer, the second oxide layer, the nitride layer, and the third oxide layer are surrounding the insulating substrate, wherein the semiconductor layer is formed over the third oxide layer.

According to another embodiment of the invention, the isolation structure is further formed in the first oxide layer, the poly-silicon layer, the second oxide layer, the nitride layer, and the third oxide layer.

According to yet another embodiment of the invention, the first oxide layer, the nitride layer and the third oxide layer are surrounding the insulating substrate, wherein the second oxide layer is surrounding the insulating substrate except the top surface, wherein the poly-silicon layer is formed below the first oxide layer.

According to yet another embodiment of the invention, the first oxide layer and the second oxide layer are surrounding the insulating substrate except the top surface, wherein the poly-silicon layer is formed below the first oxide layer, wherein the nitride layer and the third oxide layer are surrounding the insulating substrate.

According to yet another embodiment of the invention, a thickness of the first oxide layer, the second oxide layer, and the third oxide layer is between 0.1 μm and 4 μm. The first oxide layer is configured to smooth the insulating substrate. The second oxide layer is configured for adhesion. The third oxide layer is configured to smooth the nitride layer.

According to yet another embodiment of the invention, a thickness of the nitride layer is between 0.1 μm and 0.5 μm, wherein the nitride layer is configured for isolation and for acting as a diffusion barrier for any mobile contaminants which may be present within the insulating substrate.

According to an embodiment of the invention, the poly-silicon layer is N-type doped.

According to another embodiment of the invention, the poly-silicon layer is P-type doped.

According to yet another embodiment of the invention, the poly-silicon layer is undoped.

According to an embodiment of the invention, the poly-silicon is configured to hold the semiconductor structure by electrostatic charge, wherein a thickness of the poly-silicon layer is between 0.2 μm and 1.5 μm.

According to another embodiment of the invention, the engineered layer comprises: a nitride layer, a first oxide layer, and a poly-silicon layer. The nitride layer surrounds the insulating substrate. The nitride layer comprises a top surface. The first oxide layer surrounds the nitride layer except the top surface. The poly-silicon layer surrounds the first oxide layer except the top surface. The semiconductor layer is formed over the top surface and in contact with the nitride layer.

According to an embodiment of the invention, a thickness of the nitride layer is between 0.1 µm and 0.5 µm, wherein the nitride layer is configured for isolation.

According to an embodiment of the invention, the poly-silicon layer is N-type doped.

According to another embodiment of the invention, the poly-silicon layer is P-type doped.

According to yet another embodiment of the invention, the poly-silicon layer is undoped.

According to an embodiment of the invention, the poly-silicon is configured to hold the semiconductor structure by electrostatic charge, wherein a thickness of the poly-silicon layer is between 0.2 µm and 1.5 µm.

In an embodiment, a method for fabricating a semiconductor structure comprises: providing an insulating substrate; forming an engineered layer surrounding the insulating substrate; forming a semiconductor layer over the engineered layer, wherein the semiconductor layer comprises a first region and a second region; forming an isolation structure in the semiconductor layer, wherein the isolation structure is located between the first region and the second region; forming a first gate structure over the semiconductor layer within the first region; forming a first source region and a first drain region in the semiconductor layer within the first region, wherein the first source and the first drain are located on both sides of the first gate structure; forming a second gate structure over the semiconductor layer within the second region; and forming a second source region and a second drain region in the semiconductor layer within the second region, wherein the second source region and the second drain region are located on both sides of the second gate structure.

According to an embodiment of the invention, the insulating substrate comprises aluminum nitride (preferably polycrystalline), polycrystalline silicon carbide, polycrystalline diamond, or a mixture thereof.

According to an embodiment of the invention, the step of forming the engineered layer surrounding the insulating substrate further comprises: forming a first oxide layer surrounding the insulating substrate; forming a poly-silicon layer surrounding the first oxide layer; forming a second oxide layer surrounding the poly-silicon layer; forming a nitride layer surrounding the first oxide layer; and forming a third oxide layer surrounding the nitride layer, wherein the semiconductor layer is formed over the third oxide layer.

According to another embodiment of the invention, the isolation structure is further formed in the first oxide layer, the poly-silicon layer, the second oxide layer, the nitride layer, and the third oxide layer.

According to another embodiment of the invention, the step of forming the engineered layer surrounding the insulating substrate further comprises: forming a first oxide layer surrounding the insulating substrate; forming a poly-silicon layer below the first oxide layer; forming a second oxide layer surrounding the first oxide layer and the poly-silicon layer; forming a nitride layer surrounding the second oxide layer; and forming a third oxide layer surrounding the nitride layer, wherein the semiconductor layer is formed over the third oxide layer.

According to another embodiment of the invention, the insulating substrate comprises a top surface and a bottom surface, wherein the step of forming the engineered layer surrounding the insulating substrate further comprises: forming a first oxide layer surrounding the insulating substrate except the top surface; forming a poly-silicon layer below the first oxide layer; forming a second oxide layer surrounding the first oxide layer and the poly-silicon layer except the top surface; forming a nitride layer surrounding the second oxide layer, wherein the nitride layer is in contact with the top surface; and forming a third oxide layer surrounding the nitride layer, wherein the semiconductor layer is formed over the third oxide layer.

According to yet another embodiment of the invention, the step of forming the engineered layer surrounding the insulating substrate further comprises: forming a nitride layer surrounding the insulating substrate wherein the nitride layer comprises a top surface; forming a first oxide layer surrounding the nitride layer except the top surface; and forming a poly-silicon layer surrounding the first oxide layer except the top surface, wherein the semiconductor layer is in contact with the nitride layer.

A detailed description is given in the following embodiments with reference to the accompanying drawings.

BRIEF DESCRIPTION OF DRAWINGS

The invention can be more fully understood by reading the subsequent detailed description and examples with references made to the accompanying drawings, wherein.

DETAILED DESCRIPTION OF THE INVENTION

Figure 1:
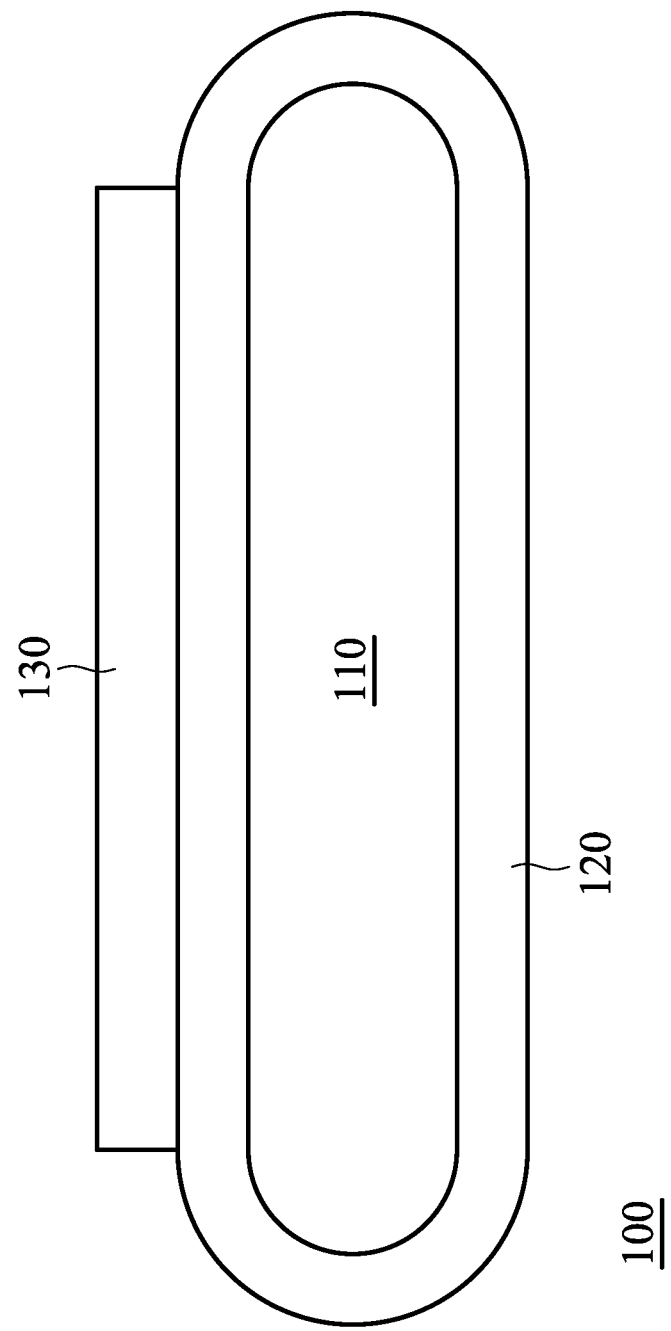
FIG. 1 is a cross-sectional view of a semiconductor structure in accordance with an embodiment of the invention.

The semiconductor device of the present disclosure is described in detail in the following description. In the following detailed description, for purposes of explanation, numerous specific details and embodiments are set forth in order to provide a thorough understanding of the present disclosure. The specific elements and configurations described in the following detailed description are set forth in order to clearly describe the present disclosure. It will be apparent, however, that the exemplary embodiments set forth herein are used merely for the purpose of illustration, and the inventive concept may be embodied in various forms without being limited to those exemplary embodiments. In addition, the drawings of different embodiments may use like and/or corresponding numerals to denote like and/or corresponding elements in order to clearly describe the present disclosure. However, the use of like and/or corresponding numerals in the drawings of different embodiments does not suggest any correlation between different embodiments. In addition, in this specification, expressions such as "first material layer disposed on/over a second material layer", may indicate the direct contact of the first material layer and the second material layer, or it may indicate a non-contact state with one or more intermediate layers between the first material layer and the second material layer. In the above situation, the first material layer may not be in direct contact with the second material layer.

It should be noted that the elements or devices in the drawings of the present disclosure may be present in any form or configuration known to those skilled in the art. In addition, the expression "a layer overlying another layer", "a layer is disposed above another layer", "a layer is disposed on another layer" and "a layer is disposed over another layer" may indicate that the layer is in direct contact with the other layer, or that the layer is not in direct contact with the other layer, there being one or more intermediate layers disposed between the layer and the other layer.

In addition, in this specification, relative expressions are used. For example, "lower", "bottom", "higher" or "top" are used to describe the position of one element relative to another. It should be appreciated that if a device is flipped upside down, an element that is "lower" will become an element that is "higher".

The terms "about" and "substantially" typically mean +/−20% of the stated value, more typically +/−10% of the stated value, more typically +/−5% of the stated value, more typically +/−3% of the stated value, more typically +/−2% of the stated value, more typically +/−1% of the stated value and even more typically +/−0.5% of the stated value. The stated value of the present disclosure is an approximate value. When there is no specific description, the stated value includes the meaning of "about" or "substantially".

It should be understood that, although the terms first, second, third etc. may be used herein to describe various elements, components, regions, layers, portions and/or sections, these elements, components, regions, layers, portions and/or sections should not be limited by these terms. These terms are only used to distinguish one element, component, region, layer, portion or section from another region, layer or section. Thus, a first element, component, region, layer, portion or section discussed below could be termed a second element, component, region, layer, portion or section without departing from the teachings of the present disclosure.

Unless defined otherwise, all technical and scientific terms used herein have the same meaning as commonly understood by one of ordinary skill in the art to which this disclosure belongs. It should be appreciated that, in each case, the term, which is defined in a commonly used dictionary, should be interpreted as having a meaning that conforms to the relative skills of the present disclosure and the background or the context of the present disclosure, and should not be interpreted in an idealized or overly formal manner unless so defined.

This description of the exemplary embodiments is intended to be read in connection with the accompanying drawings, which are to be considered part of the entire written description. The drawings are not drawn to scale. In addition, structures and devices are shown schematically in order to simplify the drawing.

In the description, relative terms such as "lower," "upper," "horizontal," "vertical,", "above," "below," "up," "down," "top" and "bottom" as well as derivative thereof (e.g., "horizontally," "downwardly," "upwardly," etc.) should be construed to refer to the orientation as then described or as shown in the drawing under discussion. These relative terms are for convenience of description and do not require that the apparatus be constructed or operated in a particular orientation. Terms concerning attachments, coupling and the like, such as "connected" and "interconnected," refer to a relationship wherein structures are secured or attached to one another either directly or indirectly through intervening structures, as well as both movable or rigid attachments or relationships, unless expressly described otherwise.

It should also be noted that the present disclosure presents embodiments of a semiconductor device, and may be included in an integrated circuit (IC) such as a microprocessor, memory device, and/or other device. The IC may also include various passive and active microelectronic devices, such as thin film resistors, other capacitors (e.g. a metal-insulator-metal capacitor, MIMCAP), inductors, diodes, metal-oxide-semiconductor field effect transistors (MOSFETs), complementary MOS (CMOS) transistors, bipolar junction transistors (BJTs), laterally diffused MOS (LDMOS) transistors, high power MOS transistors, or other types of transistors. One of ordinary skill may recognize that the high-voltage semiconductor devices may be used in other type of semiconductor elements.

FIG. 1 is a cross-sectional view of a semiconductor structure in accordance with an embodiment of the invention. As shown in FIG. 1, the semiconductor structure 100 includes an insulating substrate 110, an engineered layer 120, and a semiconductor layer 130. The engineered layer 120 is surrounding the insulating substrate 110, and the semiconductor layer 130 is formed over the engineered layer 120.

According to an embodiment of the invention, the insulating substrate 110 includes ceramic aluminum nitride (preferably polycrystalline). According to another embodiment of the invention, the insulating substrate 110 includes ceramic polycrystalline silicon carbide. According to yet another embodiment of the invention, the insulating substrate 110 includes polycrystalline diamond. According to other embodiments of the invention, the insulating substrate 110 includes a mixture thereof.

Figure 2:
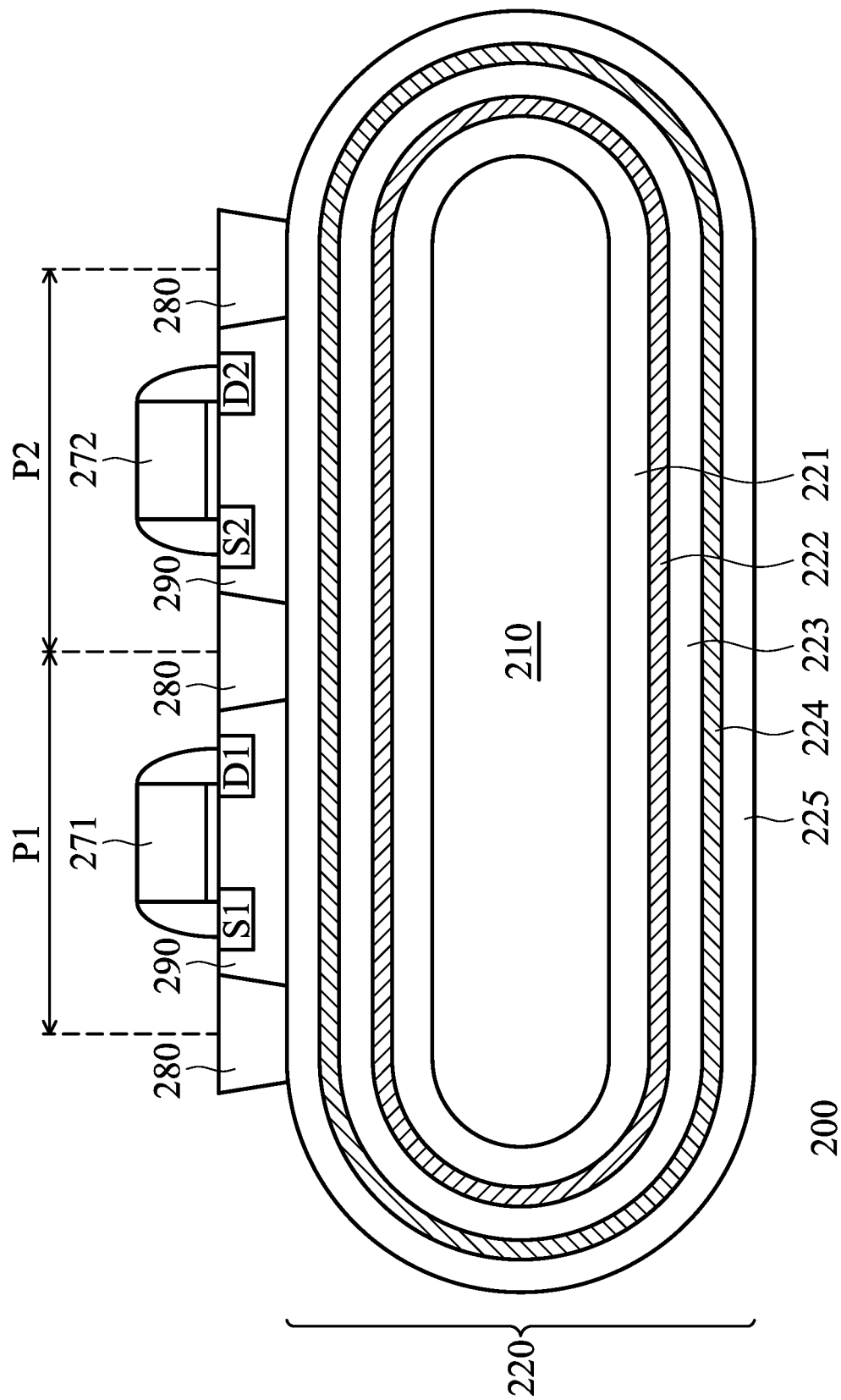
FIG. 2 is a cross-sectional view of a semiconductor structure in accordance with an embodiment of the invention.

FIG. 2 is a cross-sectional view of a semiconductor structure in accordance with an embodiment of the invention. As shown in FIG. 2, the semiconductor structure 200 includes an insulating substrate 210, an engineered layer 220, and the semiconductor layer 290, in which the engineered layer 220 surrounds the insulating substrate 210 and the semiconductor layer 290 is formed over the engineered layer 220.

The insulating substrate 210 is an insulator. According to an embodiment of the invention, the insulating substrate 210 includes ceramic aluminum nitride. According to another embodiment of the invention, the insulating substrate 210 includes ceramic polycrystalline silicon carbide. According to yet another embodiment of the invention, the insulating substrate 210 includes polycrystalline diamond. According to other embodiments of the invention, the insulating substrate 210 includes a mixture thereof.

As shown in FIG. 2, the engineered layer 220 includes a first oxide layer 221, a poly-silicon layer 222, a second oxide layer 223, a nitride layer 224, and a third oxide layer 225. The first oxide layer 221 surrounds the insulating substrate 210. According to an embodiment of the invention, the first oxide layer 221 is configured to flatten the surface of the insulating substrate 210. According to an embodiment of the invention, the thickness of the first oxide layer 221 may be in the range of 0.1 μm to 4 μm.

The poly-silicon layer 222 further surrounds the first oxide layer 221. According to an embodiment of the invention, the poly-silicon layer 222 is configured to hold the semiconductor structure 200 by electrostatic charge. In some embodiments of the invention, semiconductor processing and manufacturing equipment often require a "chuck" to hold wafers during the processing. In order to hold the wafer, electrostatic force is commonly used and the chuck is referred to as an electrostatic chuck. An electrostatic chuck (e-Chuck) is configured to stick wafers (or substrates of wafers) by electrostatic force. Since the insulating substrate 210 and other layers of the engineered layer 220 are insulators, the poly-silicon layer 222 is configured to hold electrostatic charge. Without a conductive layer (such as the poly-silicon 222), the substrate could not be held on the e-chuck since the substrate is an insulator.

According to an embodiment of the invention, the poly-silicon layer 222 is N-type doped. According to another embodiment of the invention, the poly-silicon layer 222 is P-type doped. According to yet another embodiment of the invention, the poly-silicon layer 222 is undoped. According to an embodiment of the invention, the thickness of the poly-silicon layer 222 is in a range of 0.2 µm to 1.5 µm.

The second oxide layer 223 surrounds the poly-silicon layer 222, which is configured to flatten the surface of the poly-silicon layer 222. According to an embodiment of the invention, the thickness of the second oxide layer 223 is in the range of 0.1 µm to 4 µm.

The nitride layer 224 surrounds the second oxide layer 223. According to an embodiment of the invention, the nitride layer 224 is configured as a barrier layer to block the diffusion of any contaminants from the insulating substrate 210. According to an embodiment of the invention, the thickness of the nitride layer 224 is in the range of 0.1 µm to 0.5 µm.

The third oxide layer 225 surrounds the nitride layer 224. According to an embodiment of the invention, the third oxide layer 225 is configured to flatten the surface of the nitride layer 224 such that the semiconductor layer 290 is able to be formed over the third oxide layer 225. According to an embodiment of the invention, the thickness of the third oxide layer 225 is in the range of 0.1 µm to 4 µm.

The semiconductor layer 290 includes a first region P1 and a second region P2. The isolation structures 280 are formed in the semiconductor layer 290, which is configured to divide the semiconductor layer 290 into the first region P1 and the second region P2. According to an embodiment of the invention, the isolation structures 280 are Shallow Trench Isolation (STI), which is filled with oxide.

As shown in FIG. 2, a first gate structure 271 is formed over the semiconductor layer 290 within the first region P1. A first source region S1 and a first drain region D1 is formed in the semiconductor layer 290 within the first region P 1, in which the first source region S1 and the first drain region D1 are located on both sides of the first gate structure 271. According to an embodiment of the invention, the relative position of the first source region 51 and the first drain region D1 could be reversed as shown in FIG. 2.

A second gate structure 272 is formed over the semiconductor layer 290 within the second region P2. A second source region S2 and a second drain region D2 are formed over the semiconductor layer 290 within the second region, in which the second source region S2 and the second drain region D2 are located on both sides of the second gate structure. According to an embodiment of the invention, the relative position of the second source region S2 and the second drain region D2 could be reversed as shown in FIG. 2.

According to an embodiment of the invention, the semiconductor structure 200 may not be preferred for RF applications due to the poly-silicon layer 222 being between the semiconductor layer 290 and the insulating substrate 210. Since the poly-silicon layer 222 may accumulate electrostatic charge, the electrostatic charge in the poly-silicon layer 222 could interfere the RF circuits fabricated over the semiconductor layer 290. According to an embodiment of the invention, the semiconductor structure 200 may be applied for power circuits.

Figure 3:
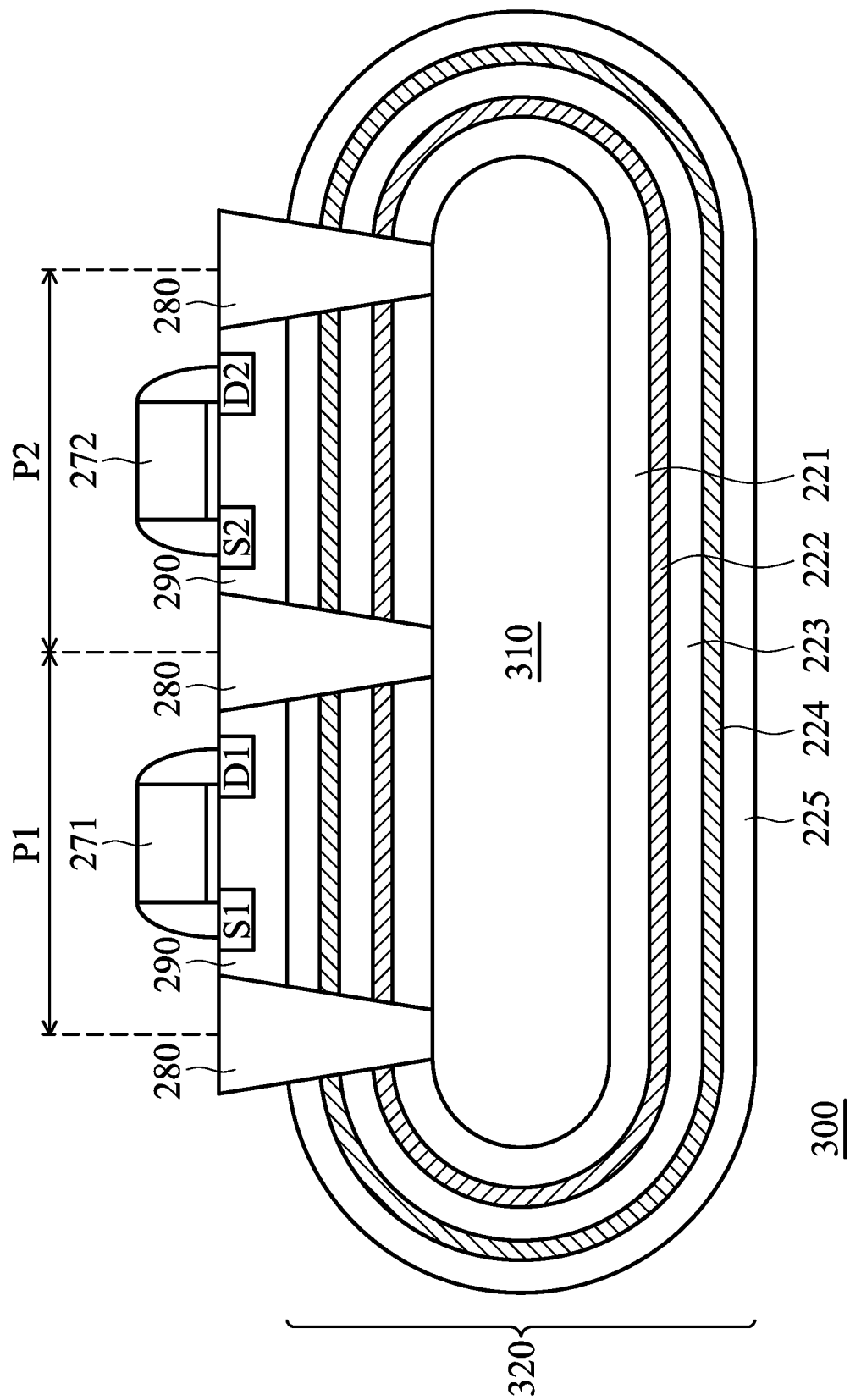
FIG. 3 is a cross-sectional view of a semiconductor structure in accordance with another embodiment of the invention.

FIG. 3 is a cross-sectional view of a semiconductor structure in accordance with another embodiment of the invention. Compared FIG. 3 with FIG. 2, the semiconductor structure 300 is identical to the semiconductor structure 200 in FIG. 2, except for the isolation structures 280. As shown in FIG. 3, the isolation structures 280 penetrate further into the first oxide layer 221, the poly-silicon layer 222, the second oxide layer 223, the nitride layer 224, and the third oxide layer 225.

According to an embodiment of the invention, the semiconductor structure 300 may not be preferred for RF applications due to the poly-silicon layer 222 being between the semiconductor layer 290 and the insulating substrate 210. Since the poly-silicon layer 222 may accumulate electrostatic charge, the electrostatic charge in the poly-silicon layer 222 could interfere the RF circuits fabricated over the semiconductor layer 290. According to an embodiment of the invention, the semiconductor structure 200 may be applied for power circuits.

Figure 4:
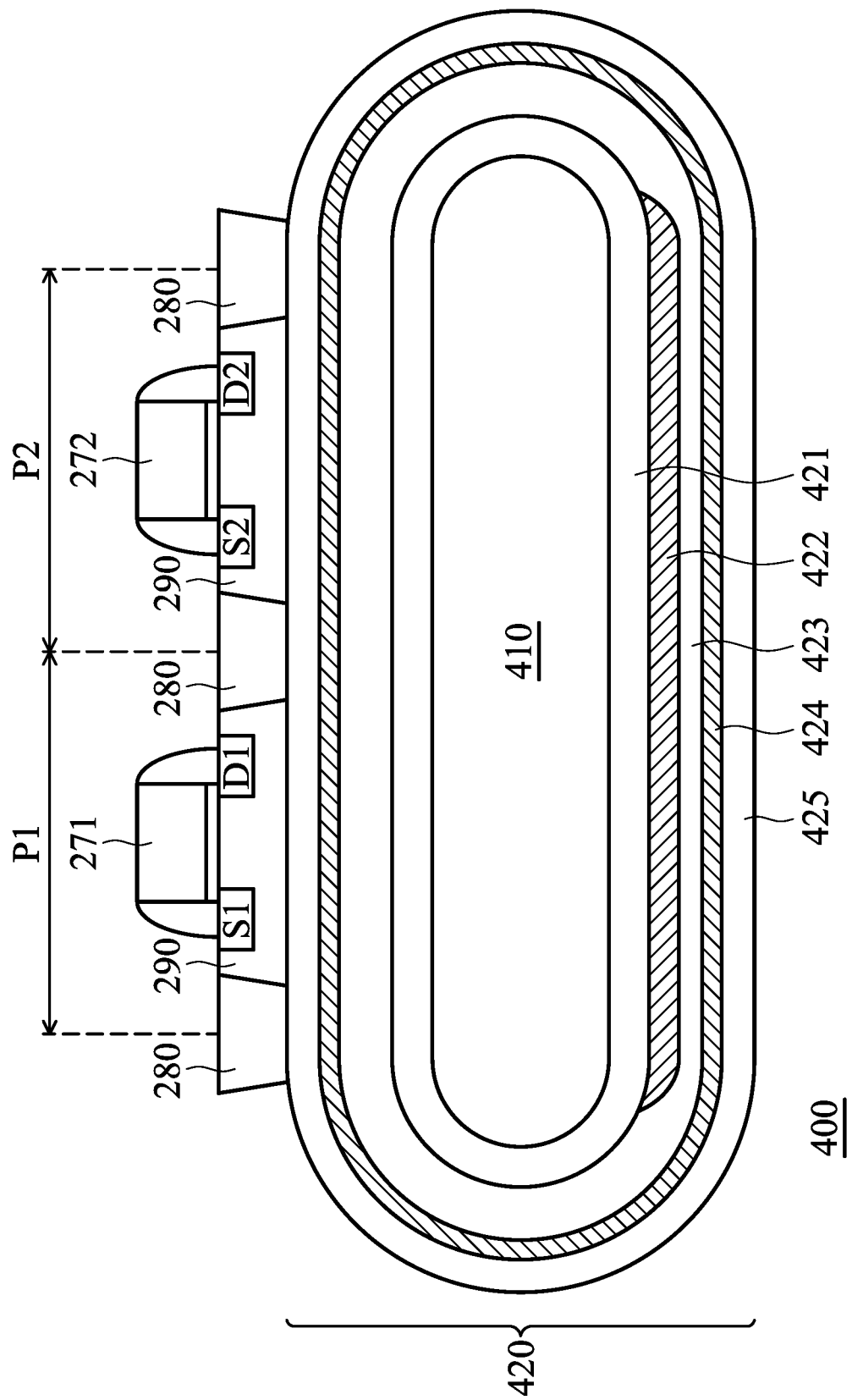
FIG. 4 is a cross-sectional view of a semiconductor structure in accordance with another embodiment of the invention.

FIG. 4 is a cross-sectional view of a semiconductor structure in accordance with another embodiment of the invention. As shown in FIG. 4, the semiconductor structure 400 includes an insulating substrate 410, an engineered layer 420, and the semiconductor layer 290, in which the engineered layer 420 surrounds the insulating substrate 410 and the semiconductor layer 290 is formed over the engineered layer 420. Comparing FIG. 4 with FIG. 2, the first gate structure 271, the first source region S1, the first drain region D1, the second gate structure 272, the second source region S2, the second drain region D2, the isolation structures 280, and the semiconductor layer 290 are identical, which would not be repeated herein.

The insulating substrate 410 is an insulator. According to an embodiment of the invention, the insulating substrate 410 includes ceramic aluminum nitride. According to another embodiment of the invention, the insulating substrate 410 includes ceramic polycrystalline silicon carbide. According to yet another embodiment of the invention, the insulating substrate 410 includes polycrystalline diamond. According to other embodiments of the invention, the insulating substrate 410 includes a mixture thereof.

As shown in FIG. 4, the engineered layer 420 includes a first oxide layer 421, a poly-silicon layer 422, a second oxide layer 423, a nitride layer 424, and a third oxide layer 425. The first oxide layer 421 surrounds the insulating substrate 410. According to an embodiment of the invention, the first oxide layer 421 is configured to flatten the surface of the insulating substrate 410. According to an embodiment of the invention, the thickness of the first oxide layer 421 may be in the range of 0.1 µm to 4 µm.

The poly-silicon layer 422 is formed under the first oxide layer 421 does not surround the entire insulating substrate 410. This is done in order to ensure that there is no semiconductor layer present under the Silicon Device layer 290. According to an embodiment of the invention, the poly-silicon layer 422 is configured to hold the semiconductor structure 400 by electrostatic charge. According to an embodiment of the invention, the poly-silicon layer 422 is N-type doped. According to another embodiment of the invention, the poly-silicon layer 422 is P-type doped. According to yet another embodiment of the invention, the poly-silicon layer 422 is undoped. According to an embodiment of the invention, the thickness of the poly-silicon layer 422 is in a range of 0.2 µm to 1.5 µm.

According to an embodiment of the invention, the poly-silicon layer 422 is first formed to surround the first oxide layer 421. Then, the poly-silicon layer 422 is etched back to the surface of the first oxide layer 421 such that the portion of the poly-silicon layer 422 under the insulating substrate 410 is left. The etch-back process to remove the poly-silicon 422 from the top surface can be done by using selective etching of the poly-silicon (preferably isotropic dry etching, but wet etching may also be used), or by polishing selectively the poly-silicon layer 422.

The second oxide layer 423 surrounds the first oxide layer 421 and the poly-silicon layer 422. In other words, the poly-silicon layer 422 is formed between the first oxide layer 421 and the second oxide layer 423 and also under the insulating substrate 410. According to an embodiment of the invention, the thickness of the second oxide layer 423 is in the range of 0.1 µm to 4 µm.

The nitride layer 424 surrounds the second oxide layer 423. According to an embodiment of the invention, the nitride layer 424 is configured as a barrier layer to block the diffusion of any contaminants from the insulating substrate 410. According to an embodiment of the invention, the thickness of the nitride layer 424 is in the range of 0.1 µm to 0.5 µm.

The third oxide layer 425 surrounds the nitride layer 424. According to an embodiment of the invention, the third oxide layer 425 is configured to flatten the surface of the nitride layer 424 such that the semiconductor layer 290 can be formed over the third oxide layer 425. According to an embodiment of the invention, the thickness of the third oxide layer 425 is in the range of 0.1 µm to 4 µm.

According to an embodiment of the invention, since there is no poly-silicon layer 422 over the insulating substrate 410, the semiconductor structure 400 could be suitable for RF applications. According to other embodiments of the invention, the poly-silicon layer 422 could be removed by back grinding for electrostatic interference minimized. Since the poly-silicon layer 422 is removed, the back-grinded semiconductor structure 400 may be better for RF applications.

Figure 5:
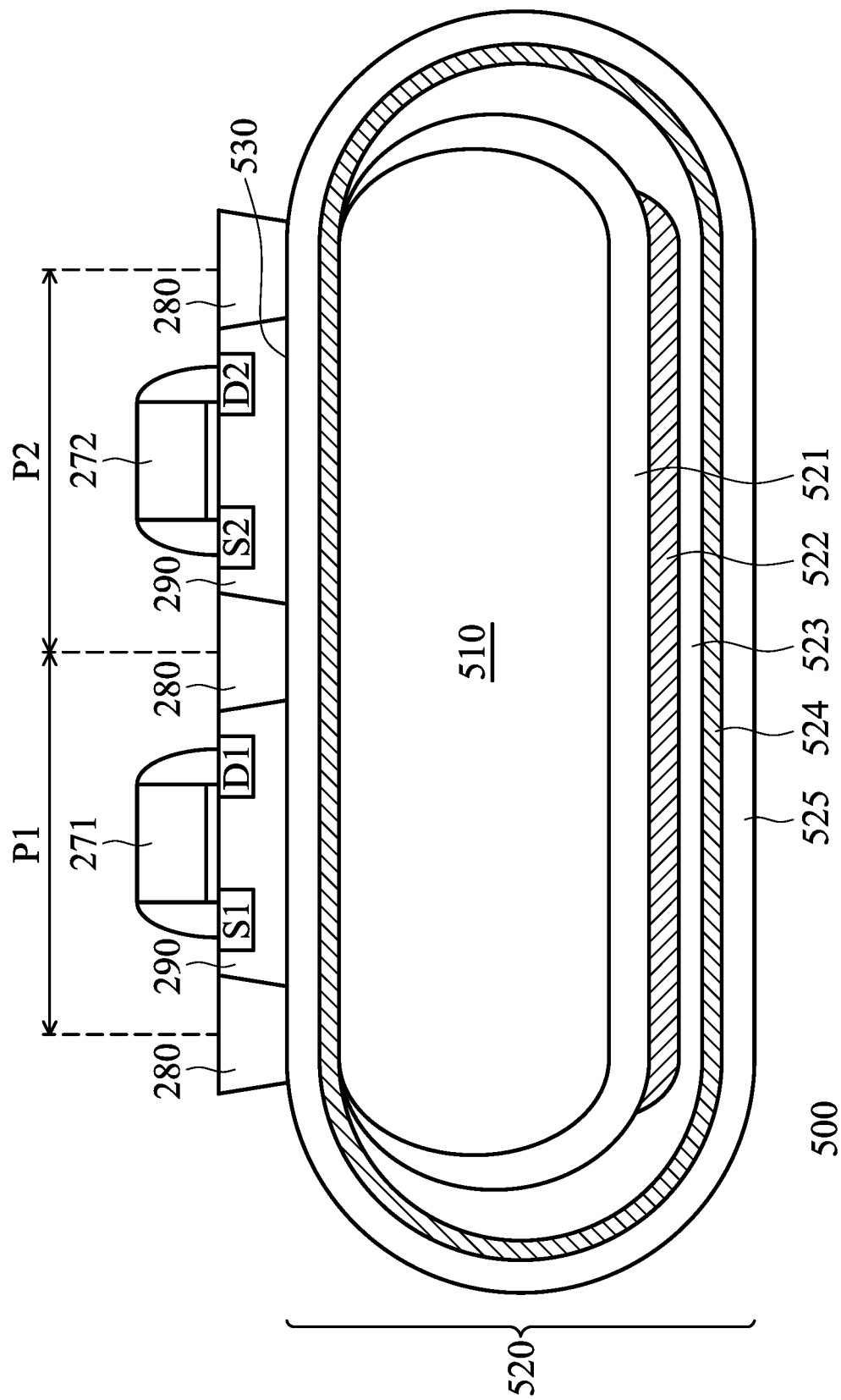
FIG. 5 is a cross-sectional view of a semiconductor structure in accordance with another embodiment of the invention.

FIG. 5 is a cross-sectional view of a semiconductor structure in accordance with another embodiment of the invention. As shown in FIG. 5, the semiconductor structure 500 includes an insulating substrate 510, an engineered layer 520, and a semiconductor layer 290. Compared FIG. 5 with FIG. 2, the semiconductor structure 500 also includes the first gate structure 271, the first source region S1, the first drain region D1, the second gate structure 272, the second source region S2, the second drain region D2, the isolation structures 280, and the semiconductor layer 290, which would not be repeated herein.

The insulating substrate 510 is an insulator. According to an embodiment of the invention, the insulating substrate 510 includes ceramic aluminum nitride. According to another embodiment of the invention, the insulating substrate 510 includes ceramic polycrystalline silicon carbide. According to yet another embodiment of the invention, the insulating substrate 510 includes polycrystalline diamond. According to other embodiments of the invention, the insulating substrate 510 includes a mixture thereof.

As shown in FIG. 5, the engineered layer 520 includes a first oxide layer 521, a poly-silicon layer 522, a second oxide layer 523, a nitride layer 524, and a third oxide layer 525. The first oxide layer 521 surrounds the insulating substrate 510 except for the top surface 530 of the insulating substrate 510. According to an embodiment of the invention, the thickness of the first oxide layer 521 may be in the range of 0.1 µm to 4 µm.

The poly-silicon layer 522 is formed under the first oxide layer 521 and does not surround the entire insulating substrate 510. According to an embodiment of the invention, the poly-silicon layer 522 is configured to hold the semiconductor structure 500 by electrostatic charge. According to an embodiment of the invention, the poly-silicon layer 522 is N-type doped. According to another embodiment of the invention, the poly-silicon layer 522 is P-type doped. According to yet another embodiment of the invention, the poly-silicon layer 522 is undoped. According to an embodiment of the invention, the thickness of the poly-silicon layer 522 is in a range of 0.2 µm to 1.5 µm.

The second oxide layer 523 surrounds the first oxide layer 521 and the poly-silicon layer 522 except for the top surface 530 of the insulating substrate 510. In other words, the poly-silicon layer 522 is formed between the first oxide layer 521 and the second oxide layer 523 and also under the insulating substrate 510. According to an embodiment of the invention, the thickness of the second oxide layer 523 is in the range of 0.1 µm to 4 µm.

According to an embodiment of the invention, when the first oxide layer 521 is formed to surround the insulating substrate 510, the first oxide layer 521 over the top surface 530 of the insulating substrate 510 is then etched back to expose the top surface 530. Etch back approaches are described above. When the poly-silicon layer 522 is formed to surround the first oxide layer 521 and the insulating substrate 510, the poly-silicon layer 522 is then etched such that only the portion of the poly-silicon layer 522 under the insulating substrate 510 and the first oxide layer 521 is left. When the second oxide layer 523 is formed to surround the insulating substrate 510, the second oxide layer 523 is etched to expose the top surface 530 of the insulating substrate 510.

The nitride layer 524 is formed to surround the second oxide layer 523 and the top surface 530 such that the nitride layer 524 is in contact with the top surface 530. According to an embodiment of the invention, the nitride layer 524 is configured as a barrier layer to block the diffusion of any contaminants from the insulating substrate 510. According to an embodiment of the invention, the thickness of the nitride layer 524 is in the range of 0.1 µm to 0.5 µm.

The third oxide layer 525 surrounds the nitride layer 524. According to an embodiment of the invention, the third oxide layer 525 is configured to flatten the surface of the nitride layer 524 such that the semiconductor layer 290 can be formed over the third oxide layer 525. According to an embodiment of the invention, the thickness of the third oxide layer 525 is in the range of 0.1 µm to 4 µm.

According to an embodiment of the invention, since there is no poly-silicon layer 522 over the insulating substrate 510, the semiconductor structure 500 could be suitable for high-performance RF applications requiring extremely low RF losses. According to other embodiments of the invention, the poly-silicon layer 522 could be removed by back grinding (or polishing)

Figure 6:
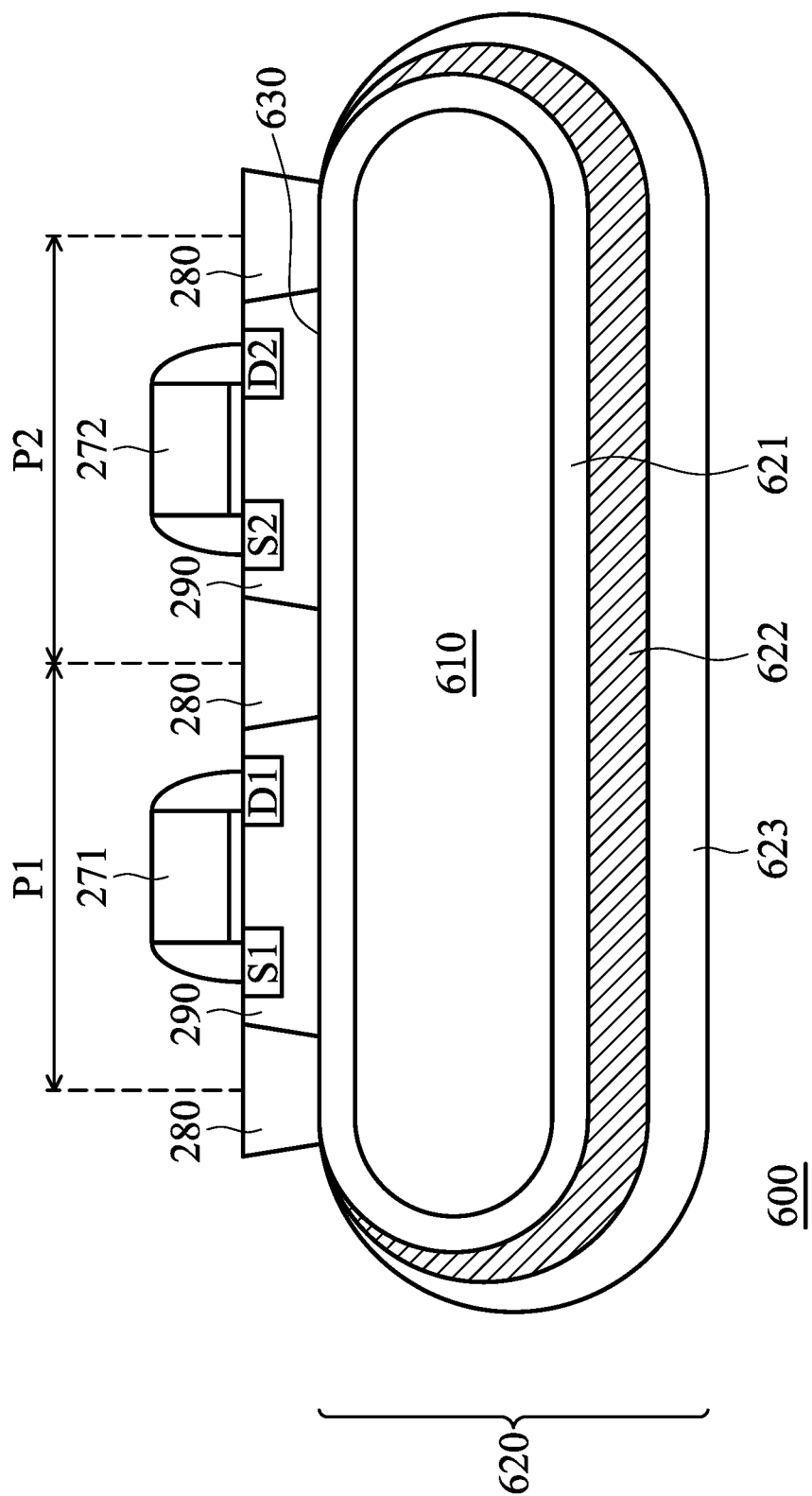
FIG. 6 is a cross-sectional view of a semiconductor structure in accordance with another embodiment of the invention.

FIG. 6 is a cross-sectional view of a semiconductor structure in accordance with another embodiment of the invention. As shown in FIG. 6, the semiconductor structure 600 includes an insulating substrate 610, an engineered layer 620, and a semiconductor layer 290. Compared FIG. 6 with FIG. 2, the semiconductor structure 500 also includes the first gate structure 271, the first source region S1, the first drain region D1, the second gate structure 272, the second source region S2, the second drain region D2, the isolation structures 280, and the semiconductor layer 290, which would not be repeated herein.

The insulating substrate 610 is an insulator. According to an embodiment of the invention, the insulating substrate 610 includes ceramic aluminum nitride. According to another embodiment of the invention, the insulating substrate 610 includes ceramic polycrystalline silicon carbide. According to yet another embodiment of the invention, the insulating substrate 610 includes polycrystalline diamond. According to other embodiments of the invention, the insulating substrate 610 includes a mixture thereof.

As shown in FIG. 6, the engineered layer 620 includes a nitride layer 621, a first oxide layer 622, and a poly-silicon layer 623. The nitride layer 621 is formed to surround the insulating substrate 610. According to an embodiment of the invention, the nitride layer 621 is configured as a barrier layer to block the diffusion of any contaminants from the insulating substrate 610. According to an embodiment of the invention, the thickness of the nitride layer 621 is in the range of 0.1 μm to 0.5 μm.

The first oxide layer 622 is formed to surround the nitride layer 621 except for the top surface 630 of the nitride layer 621 such that the top surface 630 is exposed. According to an embodiment of the invention, the first oxide layer 622 is configured to flatten the surface of the nitride layer 621. According to an embodiment of the invention, the thickness of the third oxide layer 525 is in the range of 0.1 μm to 4 μm.

The poly-silicon layer 623 is formed to surround the first oxide layer 622 such that the top surface 630 of the nitride layer 621 is exposed. According to an embodiment of the invention, the poly-silicon layer 623 is configured to hold the semiconductor structure 600 by electrostatic charge. According to an embodiment of the invention, the poly-silicon layer 623 is N-type doped. According to another embodiment of the invention, the poly-silicon layer 623 is P-type doped. According to yet another embodiment of the invention, the poly-silicon layer 623 is undoped. According to an embodiment of the invention, the thickness of the poly-silicon layer 623 is in a range of 0.2 μm to 1.5 μm.

The semiconductor layer 290 is formed over the top surface 630 of the nitride layer 622. In other words, the semiconductor layer 290 is in contact with the top surface 630 of the nitride layer 621.

According to an embodiment of the invention, when the first oxide layer 622 is formed to surround the nitride layer 621, the portion of the first oxide layer 622 over the top surface 630 is etched. When the poly-silicon layer 623 is formed to surround the first oxide layer 622, the portion of the poly-silicon layer 623 is etched to expose the top surface 630 such that the semiconductor can be formed over the top surface 630 and in contact with the nitride layer 621.

According to an embodiment of the invention, the semiconductor structure 600 may be suitable for RF applications. According to other embodiments of the invention, the poly-silicon layer 623 may be etched off after the fabrication of the semiconductor structure 600 such that the semiconductor structure 600 without the poly-silicon layer 623 may be much better for RF applications.

Figure 7:
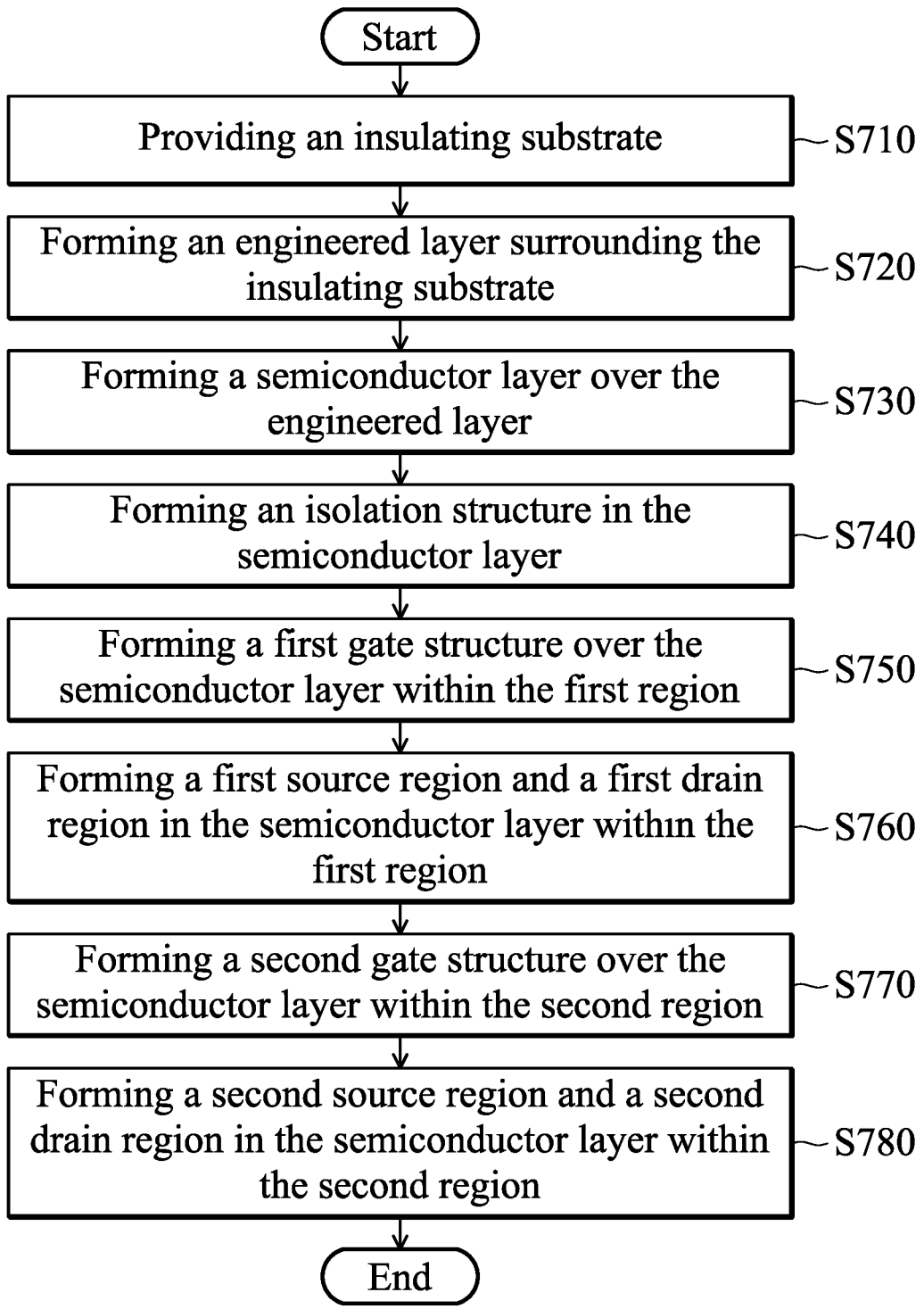
FIG. 7 is a flow chart of a method for fabricating a semiconductor structure in accordance with an embodiment of the invention.

FIG. 7 is a flow chart of a method for fabricating a semiconductor structure in accordance with an embodiment of the invention. As shown in FIG. 7, an insulating substrate is provided (Step S1). An engineered layer is formed to surround the insulating substrate (Step S2). According to an embodiment of the invention, the engineered layer may include a first oxide layer, a poly-silicon layer, a second oxide layer, a nitride layer, and a third oxide layer, which are shown as FIGS. 2-6.

Then, a semiconductor layer is formed over the engineered layer (Step S3), in which the semiconductor layer comprises a first region and a second region. An isolation structure is formed in the semiconductor layer (Step S4), in which the isolation structure is located between the first region and the second region. A first gate structure is formed over the semiconductor layer within the first region (Step S5).

A first source region and a first drain region are formed in the semiconductor layer within the first region (Step S6), in which the first source and the first drain are located on both sides of the first gate structure. A second gate structure is formed over the semiconductor layer within the second region (Step S7). A second source region and a second drain region are formed in the semiconductor layer within the second region (Step S8), in which the second source region and the second drain region are located on both sides of the second gate structure.

Substrates with lower substrate loss for RF applications are provided herein with an engineered layer surrounding an insulating substrate. Therefore, the cost of fabrication could be reasonable fair and the substrate loss could be significantly reduced for RF applications.

Although some embodiments of the present disclosure and their advantages have been described in detail, it should be understood that various changes, substitutions and alterations can be made herein without departing from the spirit and scope of the disclosure as defined by the appended claims. For example, it will be readily understood by those skilled in the art that many of the features, functions, processes, and materials described herein may be varied while remaining within the scope of the present disclosure. Moreover, the scope of the present application is not intended to be limited to the particular embodiments of the process, machine, manufacture, composition of matter, means, methods and steps described in the specification. As one of ordinary skill in the art will readily appreciate from the disclosure of the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A semiconductor structure, comprising:
   an insulating substrate;
   an engineered layer, surrounding the insulating substrate, wherein the insulating; substrate comprises a top surface and a bottom surface, wherein the engineered layer comprises;
   a first oxide layer, formed around the insulating substrate;
   a poly-silicon layer, formed around the first oxide layer;
   a second oxide layer, formed around the poly-silicon layer;
   a nitride layer, formed around the second oxide layer; and
   a third oxide layer, surrounding the nitride layer;

a semiconductor layer, formed over the engineered layer and comprising a first region and a second region;
an isolation structure. formed in the semiconductor layer and located between the first region and the second region;
a first gate structure, formed over the semiconductor layer within the first region;
a first source region and a first drain region, formed in the semiconductor layer within the first region, wherein the first source region and the first drain region are located on both sides of the first gate structure;
a second gate structure, formed over the semiconductor layer within the second region; and
a second source region and a second drain region, formed over the semiconductor layer within the second region, wherein the second source region and the second drain region are located on both sides of the second gate structure.

2. The semiconductor structure of claim 1, wherein the insulating substrate comprises aluminum nitride, polycrystalline silicon carbide, polycrystalline diamond, or a mixture thereof.

3. The semiconductor structure of claim 1, wherein the first oxide layer, the poly-silicon layer, the second oxide layer, and the nitride layer are surrounding the insulating substrate, wherein the semiconductor layer is formed over the third oxide layer.

4. The semiconductor structure of claim 3, wherein the isolation structure is further formed in the first oxide layer, the poly-silicon layer, the second oxide layer, the nitride layer, and the third oxide layer.

5. The semiconductor structure of claim 1, wherein the first oxide layer, the nitride layer and the third oxide layer are surrounding the insulating substrate, wherein the second oxide layer is surrounding the insulating substrate except the top surface, wherein the poly-silicon layer is formed below the first oxide layer.

6. The semiconductor structure of claim 1, wherein the first oxide layer and the second oxide layer are surrounding the insulating substrate except the top surface, wherein the poly-silicon layer is formed below the first oxide layer, wherein the nitride layer d the third oxide layer are surrounding the insulating substrate.

7. The semiconductor structure of claim 1, wherein a thickness of the first oxide layer, the second oxide layer, and the third oxide layer is in a range of 0.1 µm to 4 µm, wherein the first oxide layer is configured to smooth the insulating substrate, wherein the second oxide layer is configured for adhesion, wherein the third oxide layer is configured to smooth the nitride layer.

8. The semiconductor structure of claim 1, wherein a thickness of the nitride layer is in a range of 0.1 µm to 0.5 µm, wherein the nitride layer is configured for isolation.

9. The semiconductor structure of claim 1, wherein the poly-silicon layer is N-type doped.

10. The semiconductor structure of claim 1, wherein the poly-silicon layer is P-type doped.

11. The semiconductor structure of claim 1, wherein the poly-silicon layer is undoped.

12. The semiconductor structure of claim 1, wherein the poly-silicon is configured to hold the semiconductor structure by electrostatic charge, wherein a thickness of the poly-silicon layer is in a range of 0.2 µm to 1.5 µm.

13. The semiconductor structure of claim 1, wherein the engineered layer comprises:
a nitride layer, surrounding the insulating substrate, wherein the nitride layer comprises a top surface; and
a first oxide layer, surrounding the nitride layer except the top surface; and
a poly-silicon layer, surrounding the first oxide layer except the top surface, wherein the semiconductor layer is formed over the top surface and in contact with the nitride layer.

14. The semiconductor structure of claim 13, wherein a thickness of the nitride layer is in a range of 0.1 µm to 0.5 µm, wherein the nitride layer is configured for isolation.

15. The semiconductor structure of claim 13, wherein the poly-silicon layer is N-type doped.

16. The semiconductor structure of claim 13, wherein the poly-silicon layer is P-type doped.

17. The semiconductor structure of claim 13, wherein the poly-silicon layer is undoped.

18. The semiconductor structure of claim 14, wherein the poly-silicon is configured to hold the semiconductor structure by electrostatic charge, wherein a thickness of the poly-silicon layer is in a range of 0.2 µm to 1.5 µm.

19. A method for fabricating a semiconductor structure, comprising:
providing an insulating substrate;
forming an engineered layer surrounding the insulating substrate, wherein the step of forming the engineered layer surrounding the insulating substrate further comprises:
forming a first oxide layer surrounding the insulating substrate;
forming a poly-silicon layer surrounding the first oxide layer;
forming a second oxide layer surrounding the poly-silicon layer;
forming a nitride layer surrounding the first oxide layer; and
forming a third oxide layer surrounding the nitride layer;
forming a semiconductor layer over the engineered layer, wherein the semiconductor layer comprises a first region and a second region;
forming an isolation structure in the semiconductor layer, wherein the isolation structure is located between the first region and the second region;
forming a first gate structure over the semiconductor layer within the first region;
forming a first source region and a first drain region in the semiconductor layer within the first region, wherein the first source region and the first drain region are located on both sides of the first gate structure;
forming a second gate structure over the semiconductor layer within the second region; and
forming a second source region and a second drain region in the semiconductor layer within the second region, wherein the second source region and the second drain region are located on both sides of the second gate structure.

20. The method of claim 19, wherein the insulating substrate comprises aluminum nitride, polycrystalline silicon carbide, polycrystalline diamond, or a mixture thereof.

21. The method of claim 19,
wherein the semiconductor layer is formed over the third oxide layer.

22. The method of claim 21, wherein the isolation structure is further formed in the first oxide layer, the poly-silicon layer, the second oxide layer, the nitride layer, and the third oxide layer.

23. The method of claim 19, wherein the step of forming the engineered layer surrounding the insulating substrate further comprises:

forming a first oxide layer surrounding the insulating substrate;
forming a poly-silicon layer below the first oxide layer;
forming a second oxide layer surrounding the first oxide layer and the poly-silicon layer;
forming a nitride layer surrounding the second oxide layer; and
forming a third oxide layer surrounding the nitride layer, wherein the semiconductor layer is formed over the third oxide layer.

24. The method of claim 19, wherein the insulating substrate comprises a top surface and a bottom surface, wherein the step of forming the engineered layer surrounding the insulating substrate further comprises:
forming a first oxide layer surrounding the insulating substrate except the top surface;
forming a poly-silicon layer below the first oxide layer;
forming a second oxide layer surrounding the first oxide layer and the poly-silicon layer except the top surface;
forming a nitride layer surrounding the second oxide layer, wherein the nitride layer is in contact with the top surface; and
forming a third oxide layer surrounding the nitride layer, wherein the semiconductor layer is formed over the third oxide layer.

25. The method of claim 19, wherein the step of forming the engineered layer surrounding the insulating substrate further comprises:
forming a nitride layer surrounding the insulating substrate wherein the nitride layer comprises a top surface;
forming a first oxide layer surrounding the nitride layer except the top surface; and
forming a poly-silicon layer surrounding the first oxide layer except the top surface, wherein the semiconductor layer is in contact with the nitride layer.

* * * * *